US006430726B1

(12) United States Patent
Nakamura

(10) Patent No.: US 6,430,726 B1
(45) Date of Patent: Aug. 6, 2002

(54) LOGIC CIRCUIT SYNTHESIZING METHOD AND LOGIC SYNTHESIZING SYSTEM

(75) Inventor: Yuichi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/215,337

(22) Filed: Dec. 18, 1998

(30) Foreign Application Priority Data

Dec. 19, 1997 (JP) .............................................. 9-365102

(51) Int. Cl.⁷ ............................................... G06F 17/50
(52) U.S. Cl. .................. 716/2; 716/7; 716/18
(58) Field of Search .................. 716/18, 2, 7

(56) References Cited

U.S. PATENT DOCUMENTS

| | | | | |
|---|---|---|---|---|
| 5,673,200 A | * | 9/1997 | Toyanoga et al. ............. | 716/18 |
| 5,764,527 A | * | 6/1998 | Nakamura ...................... | 716/7 |
| 5,856,926 A | * | 1/1999 | Matsumoto et al. .......... | 716/18 |
| 5,862,149 A | * | 1/1999 | Carpenter et al. .......... | 714/726 |
| 5,883,808 A | * | 3/1999 | Kawarabayashi .............. | 716/2 |
| 6,026,220 A | * | 2/2000 | Cleereman et al. ........... | 703/23 |

OTHER PUBLICATIONS

Dey et al, "Circuit Partitioning for Logic Synthesis," IEEE, Mar. 1991, pp. 350–363.*
Cherabuddi et al, "Automated System Partitioning for Synthesis of Multi–Chip Modules," IEEE, Mar. 1994, pp. 15–20.*
Eikerline et al, "Automatic Structuring and Optimization of Hierarchical Designs," IEEE, Sep. 1996, pp. 134–139.*
Kawaguchi et al, "A RTL Partitioning Method with a Fast Min–Cut Improvement Algorithm," IEEE, Jan. 1997, pp. 57–60.*
Stok et al "BooleDozer Logic Synthesis for ASICs", IBM Journal of Research Development, vol. 40 No. 4, Jul. 1996, pp. 407–430.
Watanabe et al. "Incremental Synthesis for Engineering Changes", Proceeding of IEEE International Conference on Computer Design, 1991, pp. 40–43.

* cited by examiner

Primary Examiner—Vuthe Siek
(74) Attorney, Agent, or Firm—Foley & Lardner

(57) ABSTRACT

A logic circuit synthesizing method for optimizing a given logic circuit for satisfying a given area, delay and other constraints, divides an inputted logic circuit into a plurality of partial circuits on the basis of a circuit information of the logic circuit, outputs a resultant circuit by providing logic optimization per each partial circuit for satisfying constraint and synthesizing the partial circuits provided logic optimization, upon design modification of the logic circuit, divides the resultant circuit in the same manner of preceding time of division, and outputs a resultant circuit by providing logic optimization only for the partial circuit, for which design modification is effected, re-using the former resultant circuit for the partial circuits other than that subject to design modification and synthesizing the modified partial circuit which is newly optimized and the re-used partial circuits.

13 Claims, 10 Drawing Sheets

FIG. 7
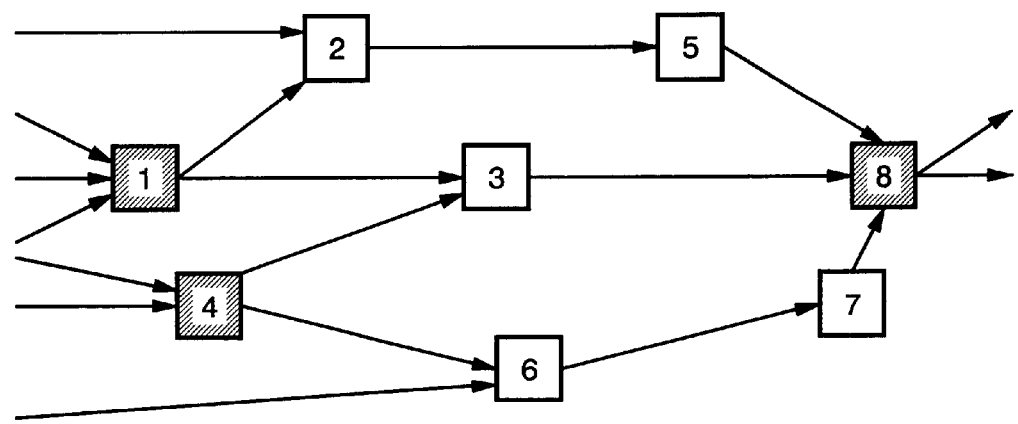
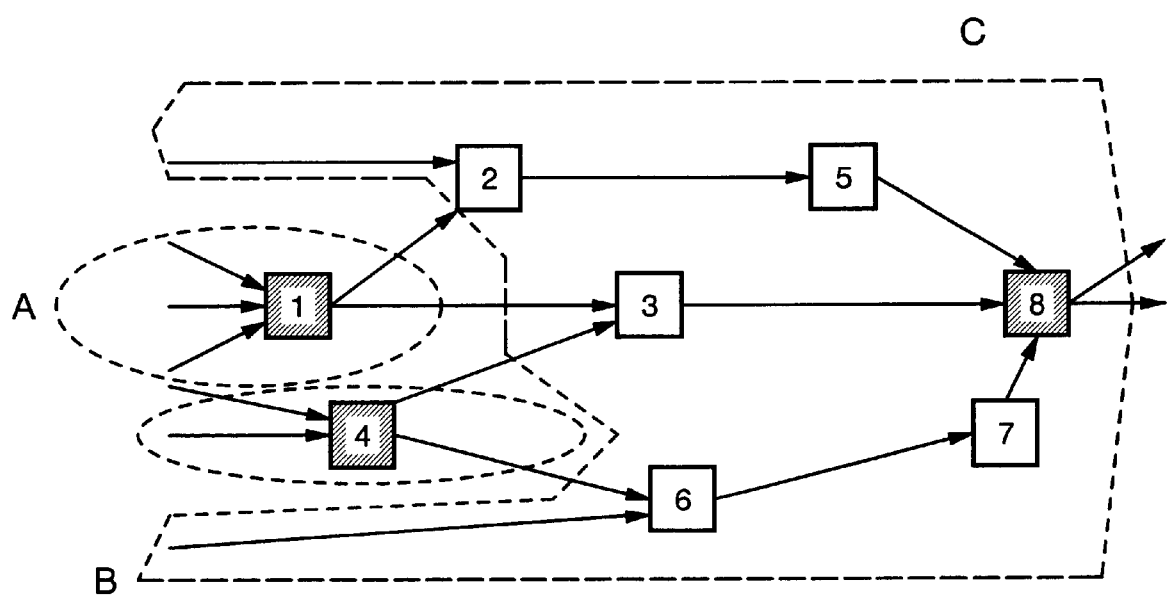

LOGIC CIRCUIT SYNTHESIZING METHOD AND LOGIC SYNTHESIZING SYSTEM

BACKGROUND OF THE INVENTION

1. Field of the Invention

The present invention relates generally to an automatic synthesizing technology of logic circuits. More particularly, the invention relates to a logic circuit synthesizing method and a logic synthesizing system optimizing logic circuits for satisfying given constraint, such as area, delay and so forth. Further specifically, the invention relates a logic circuit synthesizing technology optimizing logic circuits for satisfying given constraint, such as area, delay and so forth under a premise of design modification.

2. Description of the Related Art

As the conventional automatic synthesizing technology of logic circuits, a technology disclosed in L. Stok et al., ASICs (BooleDozer: Logic Synthesis for ASICs), July, 1996, IBMJ. RES. Development, pp 407–430) and so forth, is made reference to, for example.

In this technology, in the optimization process of the circuit, management has been effect as to which part the circuit before optimization corresponds. Therefore, when modification of the circuit is effected, while rough identification of a partial circuit concerning which portion of the circuit has been modified, storing of the circuit before modification for the portion other than that modified associating with modification of the circuit, is not possible.

On the other hand, in Y. Watanabe et al., "Incremental Synthesis for Engineering Changes" Proceeding of IEEE International Conference on Computer Design, 1991, pp 40 to 43, there has been disclosed a method for maintaining a circuit after design modification modified only by modification of connection of wiring, substantially equivalent to the circuit before design modification. However, it cannot be guaranteed that any modifications are only modifications of connections of the wiring and a condition before design modification is maintained. Also, since the disclosed method performs calculation concerning addition of wiring using a logic information of the overall circuit, process is complicate and application for a large scale circuit is difficult.

As set forth above, the conventional automatic synthesizing technology of the logic circuits encounters the following problems.

A first problem is that when a part of the circuit is subject to design modification, storing of the circuit before modification for the portion other than that modified, associating with modification of the circuit, is not possible The second problem is that it cannot be guaranteed that the condition before modification is stored, and since addition of wiring is performed on the basis of logic information of the overall circuit, process becomes complicate to cause difficulty in application for a large scale circuit.

SUMMARY OF THE INVENTION

A first object of the present invention is to provide a logic circuit synthesizing method and system which generates new circuit for peripheral portion of the circuit portion subjecting design modification and enables to maintain circuit condition before design modification in the case where a part of the circuit is subject to design modification.

A second object of the present invention is to provide a logic circuit synthesizing method and system which can output a result of synthesis satisfying constraint, such as area, delay and so forth as required for the circuit, comparable with result of synthesis in the logic circuit synthesizing method not premised to design modification, even when design modification is premised.

A third object of the present invention is to provide a logic circuit synthesizing method and system premised to design modification not depending upon circuit scale.

According to the first aspect of the invention, a logic circuit synthesizing method for optimizing a given logic circuit for satisfying a given area, delay and other constraints, comprising the steps of dividing an inputted logic circuit into a plurality of partial circuits on the basis of a circuit information of the logic circuit, outputting a resultant circuit by providing logic optimization per each partial circuit for satisfying constraint and synthesizing the partial circuits provided logic optimization, upon design modification of the logic circuit, dividing the resultant circuit in the same manner of preceding time of division, and outputting a resultant circuit by providing logic optimization only for the partial circuit, for which design modification is effected, re-using the former resultant circuit for the partial circuits other than that subject to design modification and synthesizing the modified partial circuit which is newly optimized and the re-used partial circuits.

In the preferred construction, in division of the logic circuit into the partial circuits, circuit elements forming the logic circuit are classified into circuit elements having fan out greater than or equal to 2 and circuit elements having fan out 1, with taking the circuit element having fan out greater than or equal to 2 as a unit of division, circuit elements having fan out 1 connected to input terminal of the circuit elements having fan out greater than or equal to 2 are aggregated for combination, and on the basis of the classification result and the combination result, the logic circuit is divided into partial circuits.

In another preferred construction, in division of the logic circuit into the partial circuits, circuit elements forming the logic circuit are classified into circuit elements having fan out greater than or equal to 2 and circuit elements having fan out 1, with taking the circuit element having fan out greater than or equal to 2 as a unit of division, circuit elements having fan out 1 connected to input terminal of the circuit elements having fan out greater than or equal to 2 are aggregated for combination by sequentially tracing the circuit elements having fan out 1 up to reaching to the circuit element having fan out greater than or equal to 2, and on the basis of the classification result and the combination result, the logic circuit is divided into partial circuits.

In another preferred construction, in logic optimization process of the partial circuit, logic optimization is performed for all of combinations of adjacent divided partial circuits, as a result of the logic optimization, selecting combination of partial circuits the closest to a constraint of the circuit input upon optimization, and the combination of the partial circuits is taken as a new partial circuit.

According to the second aspect of the invention, a logic circuit synthesizing system for optimizing a given logic circuit for satisfying a given area, delay and other constraints, comprises logic dividing means for dividing an inputted logic circuit into a plurality of partial circuits, constraint input means for inputting area, delay or other constraint given for the partial circuits, division optimizing means for executing logic optimization for each of the partial circuits of the logic circuit input for the first time and performing optimization in order to satisfy the constraint, newly optimizing means for newly executing logic optimization only for the partial circuit, in which modification is caused, when modification of the circuit is effected, re-using means for holding the results of logic optimization at the first time with respect to the partial circuits other than the partial circuit for which modification is effected, combining means for combining the partial circuits held by the re-using means and the partial circuit newly performed logic optimization, and synthesized result outputting means for outputting a synthesizing result by the division optimizing means or combination result by the combining means.

In the preferred construction, the logic circuit synthesizing system further comprises first time circuit input means for initially inputting the logic circuit for the logic circuit, for which design modification is expected, modified partial circuit inputting means for performing input of the partial circuit after design modification, and former time circuit input means for inputting the logic circuit as a result of synthesis for the former time.

In another preferred construction, the logic dividing means comprises circuit element classifying means for classifying circuit elements having fan out 1 and circuit elements having fan out greater than or equal to 2 concerning circuits elements forming the logic circuit, and cone generating means for performing division with taking the circuit element having fan out greater than or equal to 2 as a unit for division and aggregating circuit elements having fan out 1 connected to the input terminal of the circuit elements having fan out greater than or equal to 2.

In another preferred construction, the cone generating means performs division with taking the circuit element having fan out greater than or equal to 2 as a unit for division and aggregating circuit elements having fan out 1 connected to input terminal of the circuit elements having fan out greater than or equal to 2 are aggregated for combination by sequentially tracing the circuit elements having fan out 1 up to reaching to the circuit element having fan out greater than or equal to 2.

In another preferred construction, the divided logic optimizing means comprises logic optimizing means for combination for performing logic optimization for all of combinations of adjacent divided partial circuits, combination judging means for selecting a combination of the partial circuits closest to the constraint of the circuit input upon optimization as a result of the logic optimization, and cone merge means for taking the selected combination of the partial circuits as a new partial circuit.

In another preferred construction, the logic dividing means comprises circuit element classifying means for classifying circuit elements having fan out 1 and circuit elements having fan out greater than or equal to 2 concerning circuits elements forming the logic circuit, and cone generating means for performing division with taking the circuit element having fan out greater than or equal to 2 as a unit for division and aggregating circuit elements having fan out 1 connected to the input terminal of the circuit elements having fan out greater than or equal to 2, and the divided logic optimizing means comprises logic optimizing means for combination for performing logic optimization for all of combinations of adjacent divided partial circuits, combination judging means for selecting a combination of the partial circuits closest to the constraint of the circuit input upon optimization as a result of the logic optimization, and cone merge means for taking the selected combination of the partial circuits as a new partial circuit.

According to another aspect of the invention, a storage medium storing a computer program performing logic circuit synthesis for optimizing a given logic circuit for satisfying a given area, delay and other constraints, comprising the steps of dividing an inputted logic circuit into a plurality of partial circuits on the basis of a circuit information of the logic circuit, outputting a resultant circuit by providing logic optimization per each partial circuit for satisfying constraint and synthesizing the partial circuits provided logic optimization, upon design modification of the logic circuit, dividing the resultant circuit in the same manner of preceding time of division, and outputting a resultant circuit by providing logic optimization only for the partial circuit, for which design modification is effected, re-using the former resultant circuit for the partial circuits other than that subject to design modification and synthesizing the modified partial circuit which is newly optimized and the re-used partial circuits.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 7 is an illustration diagrammatically showing one example of the second embodiment of a logic dividing method according to the present invention;

DESCRIPTION OF THE PREFERRED EMBODIMENT

Figure 1:
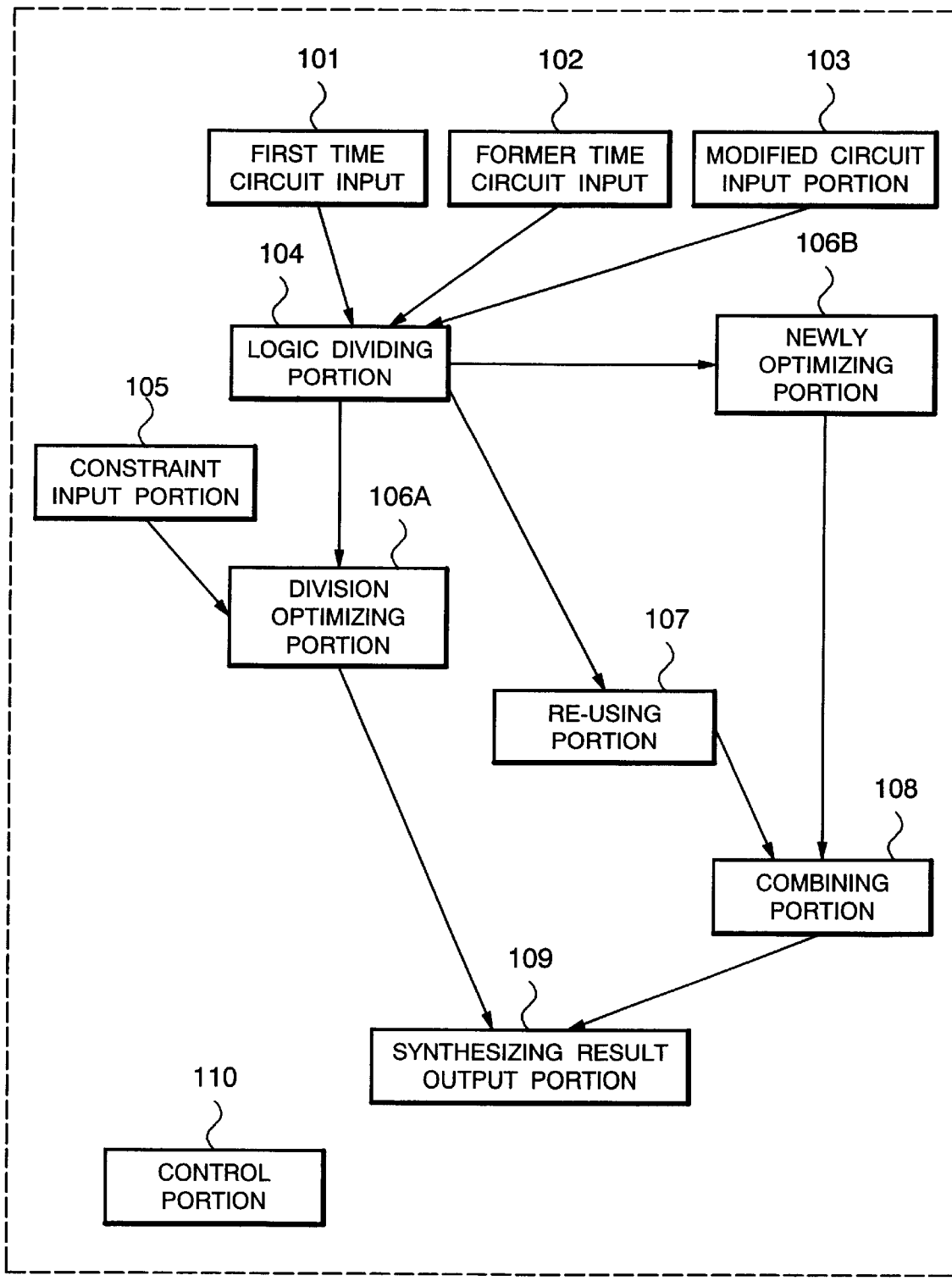
FIG. 1 is a block diagram showing a construction of the first embodiment of a logic circuit synthesizing system according to the present invention.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

A logic circuit synthesizing method according to the present invention divides a circuit inputted into a plurality of partial circuits and provides logic optimization per each partial circuit, synthesizes the partial circuit provided logic optimization to output a resultant circuit. During the process, division information is stored. When modification of the circuit is effected, the resultant circuit is divided in the similar manner as the former division to provide logic optimization only for the modified partial circuit. The partial circuits other than that modified are used as they are to synthesize with the modified partial circuit which is subject logic optimization, to output the resultant circuit incorporating modification.

In greater detail, the logic circuit synthesizing method according to the present invention includes (a) a step of dividing a first time logic circuit inputted into a plurality of divided partial circuits for a circuit expected design modification, (b) a step of providing individual logic optimization for each divided partial circuit for satisfying constraint, such as area, delay and so forth, given for each divided partial circuit with maintaining divided condition and outputting a synthesizing result of the divided partial circuits provided logic optimization, (c) next, upon occurrence of modification of circuit, a step of inputting circuit of the former synthesizing result to divide the inputted circuit in the similar manner as the prevision division, and (d) a step of newly providing logic optimization only for the divided partial circuit corresponding to the modified portion, utilizing partial circuits before modification for the divided partial circuits other than the modified portion, combining the divided partial circuits before modification and the divided partial circuit newly provided logic optimization for outputting the synthesizing result.

The respective steps of the process set forth above are controlled by a program executed by a data processing system including input means, output means, storage means, such as a file device or so forth, a main storage device, an arithmetic means and so forth. A logic circuit synthesizing system according to the present invention, which realizes the foregoing logic circuit synthesizing method, is constructed with a first time circuit input portion 101 inputting a first time circuit for a circuit expected design modification, a modified circuit input portion 103 inputting a circuit after design modification, a former circuit input portion 102 inputting a result of synthesis for the last time after design modification, a constraint input portion 105 inputting constraint, such as area, delay and so forth provided for each circuit with maintaining its division mode, a division optimizing portion 106A executing individual logic optimization for satisfying input constraint, a newly optimizing portion 106B for newly executing logic optimization only for divided portion upon occurrence of modification of the circuit, a re-using portion 107 for re-using the circuits before modification as they are for the portion other than the modified portion, a combining portion 108 for combining the re-used partial circuits and newly optimized partial circuit, a synthesizing result output portion 109 for outputting a synthesizing result and a control portion for controlling overall system.

Figure 2:
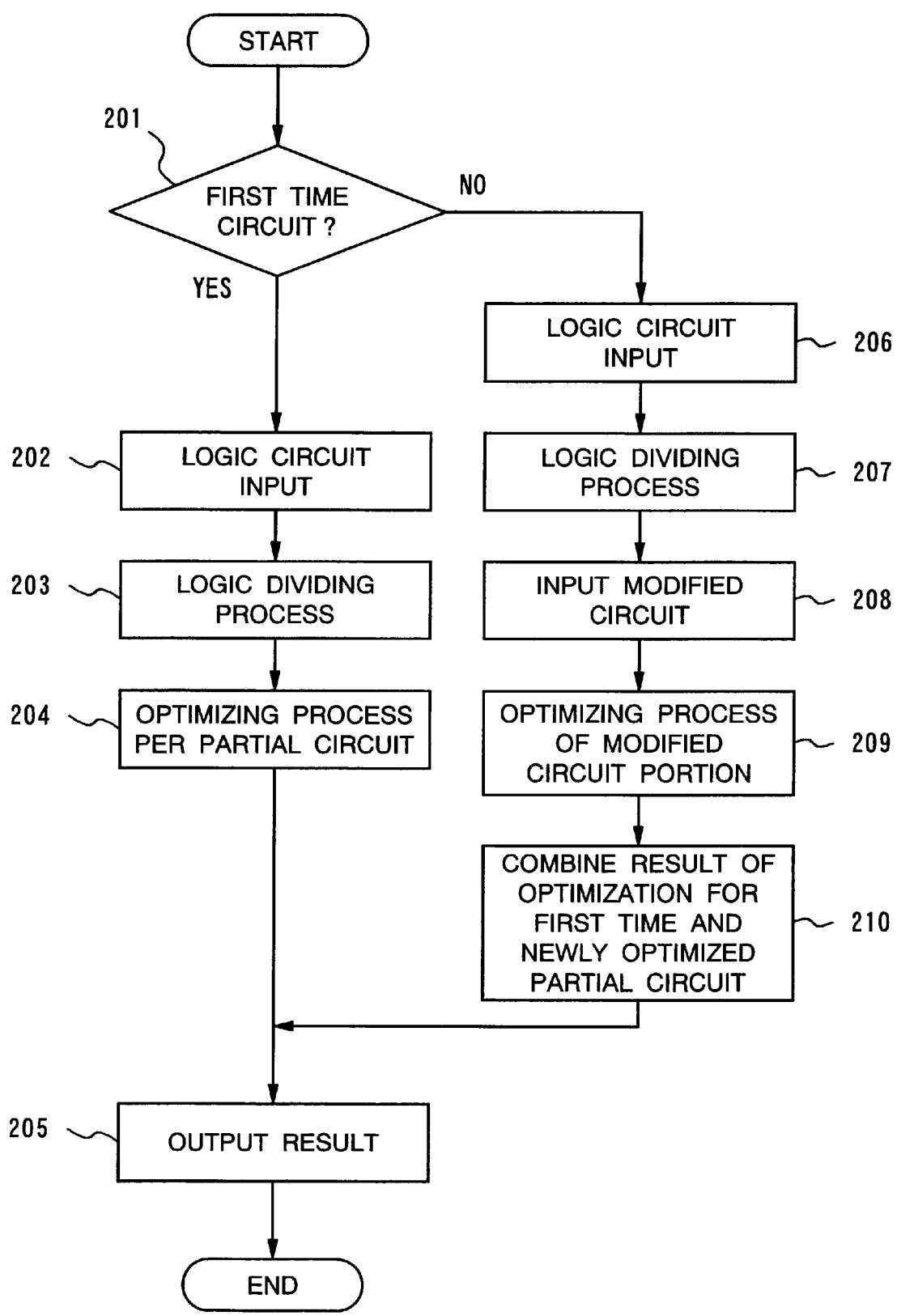
FIG. 2 is a flowchart for explaining a process of the first embodiment of the logic circuit synthesizing system.

Discussing process procedure of the embodiment of the present invention with reference to FIG. 2, an initial logic circuit, for which design modification is expected, is input from the first time circuit input portion 101 (steps 201 and 202). The inputted logic circuit is then divided into a plurality of partial circuits by the logic dividing portion 104 (step 203).

With maintaining divided form, logic optimization is executed for each individual partial circuit in order to satisfy constraint, such as area, delay and so on given for each circuit inputted by the constraint input portion 105, by the division optimizing portion 106A (step 204). The logic circuit after optimization is output as synthesizing result by the synthesizing result outputting portion (step 205).

Next, when modification is caused in the circuit, by the former circuit input portion 102, initial synthesizing result is input (step 201 and 206). By the division optimization portion 104, the inputted circuit is divided into the partial circuits in the same manner as the first time on the basis of the division information of the first time (step 207). Then, the circuit of the modified portion is input by the modified circuit input portion 103 (step 208). By the newly optimizing portion 106B, only for the modified portion, the logic optimization is newly executed (step 209).

Concerning partial circuits other than modified portion, the partial circuits before modification are used as they are by the re-using portion 107. Then, the re-used partial circuits and the newly optimized partial circuit are combined by the combining portion 108 (step 210). Then, the synthesized result is output by the synthesized result output portion 109 (step 205).

Control of the process by respective processing portions set forth above is performed by the control portion 110.

It should be noted that, upon performing logic optimization for the divided partial circuits, the constraint, such as area, delay and so forth sought by the logic optimization is not uniform for individual divided partial circuit sand can apply excessive demand. Therefore, an appeasement determining means determined constraint adapted for optimization extremes per the partial circuit from the given constraint. The division optimization portion 106A performs division optimization after application of new constraint by the appeasement determining means.

Figure 3:
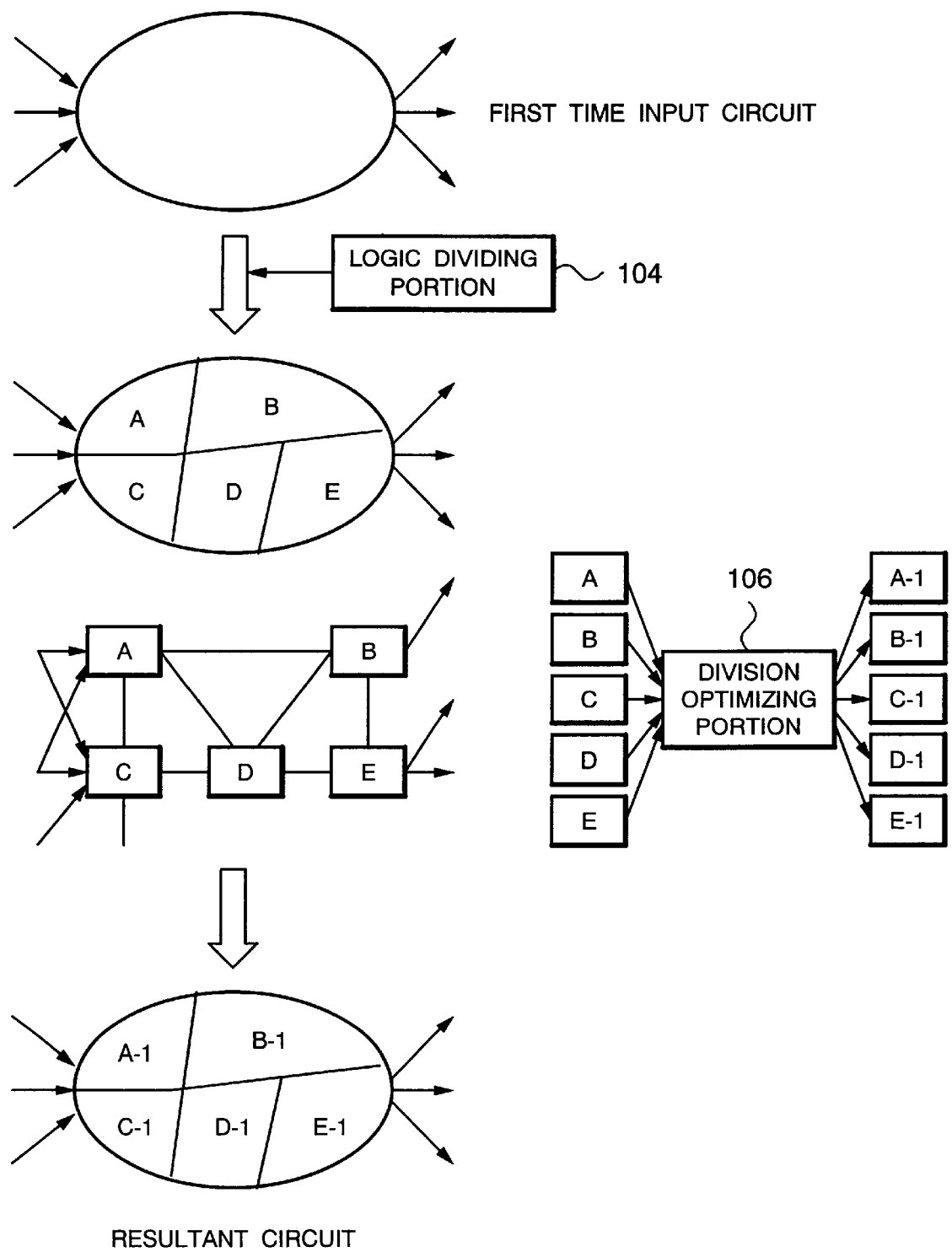
FIG. 3 is an explanatory illustration diagrammatically showing one example of a first time circuit synthesis in the first embodiment of the present invention.

FIG. 3 is an explanatory illustration diagrammatically showing one example of synthesizing method for the first time in the first embodiment of the logic circuit synthesizing system according to the present invention.

At first, the logic circuit constituted of logic elements, such as AND, OR, NAND, NOR, XOR, XNOR, flip-flop and so forth and wiring connecting the logic elements, is input to the first time logic circuit input portion 101. The logic circuit is assumed that modification is scheduled. On the other hand, the constraint, such as area, delay and so forth, required for the circuit is input to the constraint input portion 105.

In synthesis for the first time, the inputted circuit is divided into divided partial circuits "A", "B", "C", "D", "E" as shown in FIG. 3, in the logic dividing portion 104. Concerning dividing method for the first time, division information is stored in the logic dividing portion 104. Accordingly, when the modified circuit is input, division is performed similarly.

The divided logic circuit for the first time (logic circuit input from the first time circuit input portion 101) is taken as the partial circuit per divided unit. Each individual partial circuit "A", "B", "C", "D", "E" is subject to logic optimization process by the division optimizing portion 106A for optimization to be close to the constraint input from the constraint input portion 105 as much as possible. Per each partial circuit, logic optimization is executed by the division optimizing portion 106A. Then, by synthesizing the optimized partial circuits "A-1", "B-1", "C-1", "D-1" and "E-1", the logic circuit consisted of the logic elements and wiring is output from the synthesized result output portion 109. The synthesizing process for the first time before modification is completed through the foregoing process.

Figure 4:
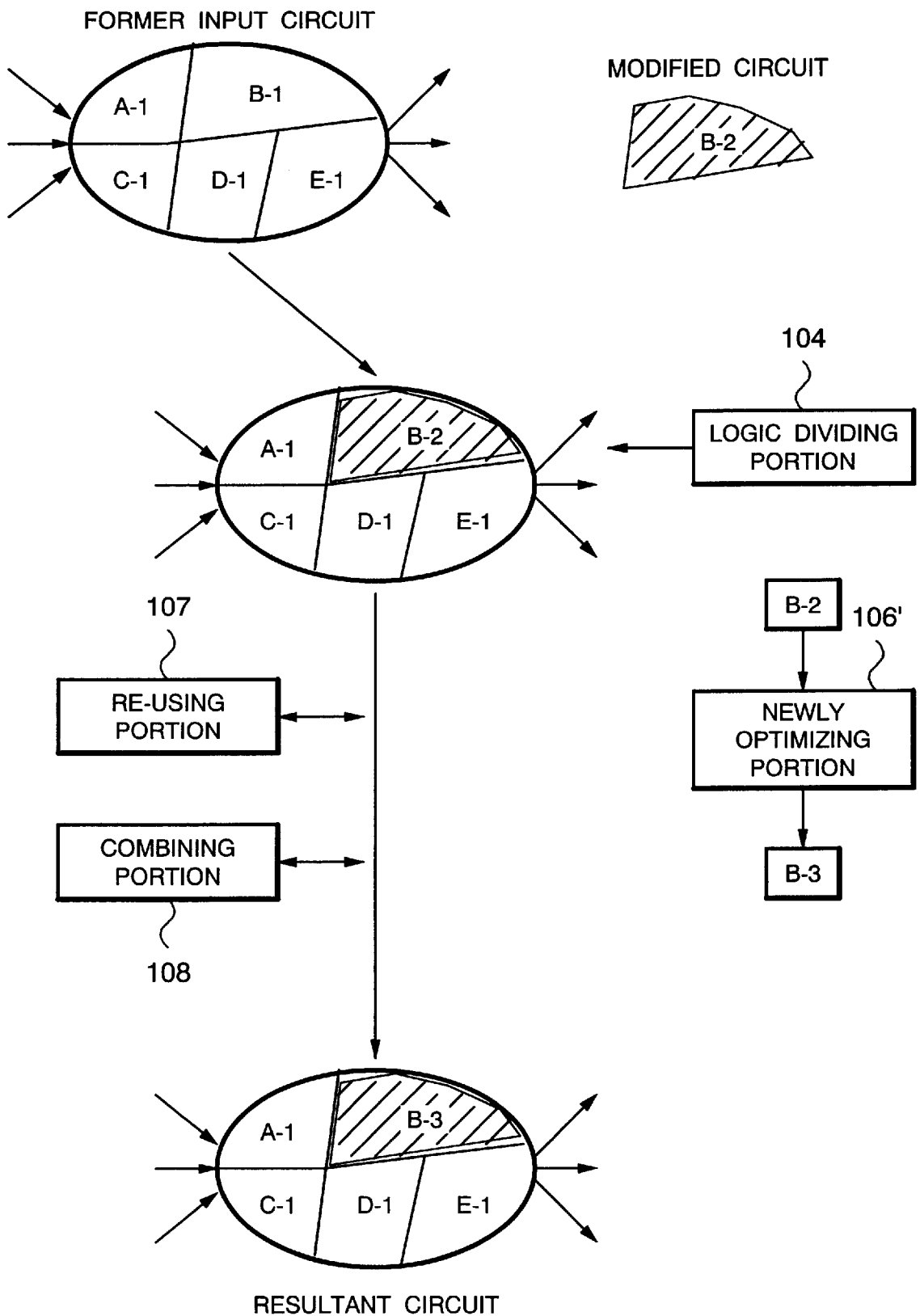
FIG. 4 is an explanatory illustration diagrammatically showing one example of synthesis of modified circuits in the first embodiment of the present invention.

FIG. 4 is an explanatory illustration diagrammatically showing one example of a modified circuit synthesizing method in the first embodiment of the logic circuit synthesizing system according to the present invention.

In the synthesizing process at the second and subsequent times where design modification is caused, the logic circuit as a result of optimization for the last time, is input from the former time circuit input portion 102. Similarly to the former time (in this case, the first time), by the logic dividing portion 104, the input logic circuit is divided into a plurality of partial circuits. Here, as shown in FIG. 3, the logic circuit is divided into the partial circuits "A-1", "B-1", "C-1", "D-1" and "E-1".

In the result of division, the content of the divided partial circuit is different from the logic circuit of the first time. However, since the optimization process of the first time is performed per divided partial circuit, the dividing portion and number of division are the same as the first time.

A modified partial circuit "B-2" where design modification is caused, is input from the modified circuit input portion 103. At this condition, concerning respective divided partial circuits, the divided partial circuit which is modified and other divided partial circuits which are not modified can be discriminated. On the other hand, from the constraint input portion 105, the constraint the same as constraint for the circuit of the first time is input.

The divided partial circuits "A-1", "C-1", "D-1" and "E-1" which are not modified, are held as the resultant partial circuits after optimization of the circuit of the first time, by re-using portion 107. Optimization is newly executed to satisfy the constraint, such as area, delay and soon, for the divided partial circuit "B-2" which is modified, to output as a divided partial circuit "B-3". The divided partial circuits "A-1", "C-1", "D-1" and "E-1" held as the resultant partial circuits after optimization of the circuit of the first time, by re-using portion 107 and the divided partial circuit "B-3" derived through newly executed optimization are combined or synthesized by the combining portion 108 to output a result by the synthesized result output portion 109. These control is performed by the control portion 110.

Figure 5:
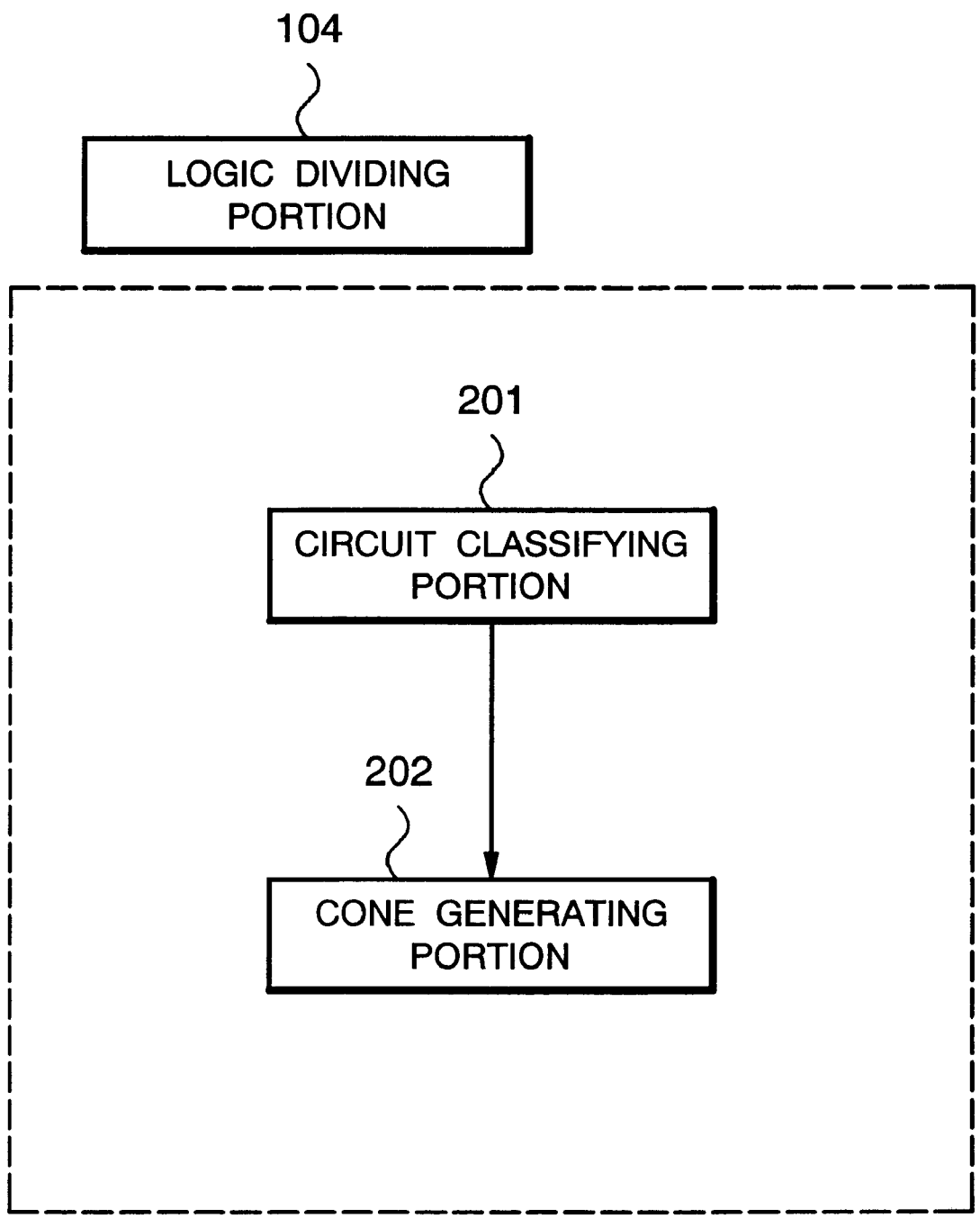
FIG. 5 is a block diagram showing a construction of the second embodiment of a logic dividing portion according to the present invention.

Next, discussion of the second embodiment of the present invention will be given. FIG. 5 is a block diagram showing a construction of the second embodiment of the logic circuit synthesizing system according to the present invention.

Referring to FIG. 5, in the second embodiment of the present invention, the logic dividing portion 104 of the first embodiment dividing the logic circuit into partial circuits is constructed with a circuit element classifying portion 201 classifying circuit elements (circuit components) having fan out greater than or equal to "2" and circuit elements (circuit components) other than the former, and a cone generating portion 202 dividing in a condition combining the circuit elements having fan out "1" to the input of the circuit element having fan out grater than or equal to "2" as much as possible.

As a dividing method the logic dividing portion 104, concerning circuit elements (circuit components), such as "AND", "OR", "NOR", "NAND", "XOR", "XNOR", "flip-flop" and so forth, the circuit elements having fan out greater than or equal to "2" are classified by the circuit element classifying portion 201. The cone generating portion 202 connects the circuit elements of fan out 1 to the input of the circuit element having fan out greater than or equal to 2.

Figure 6:
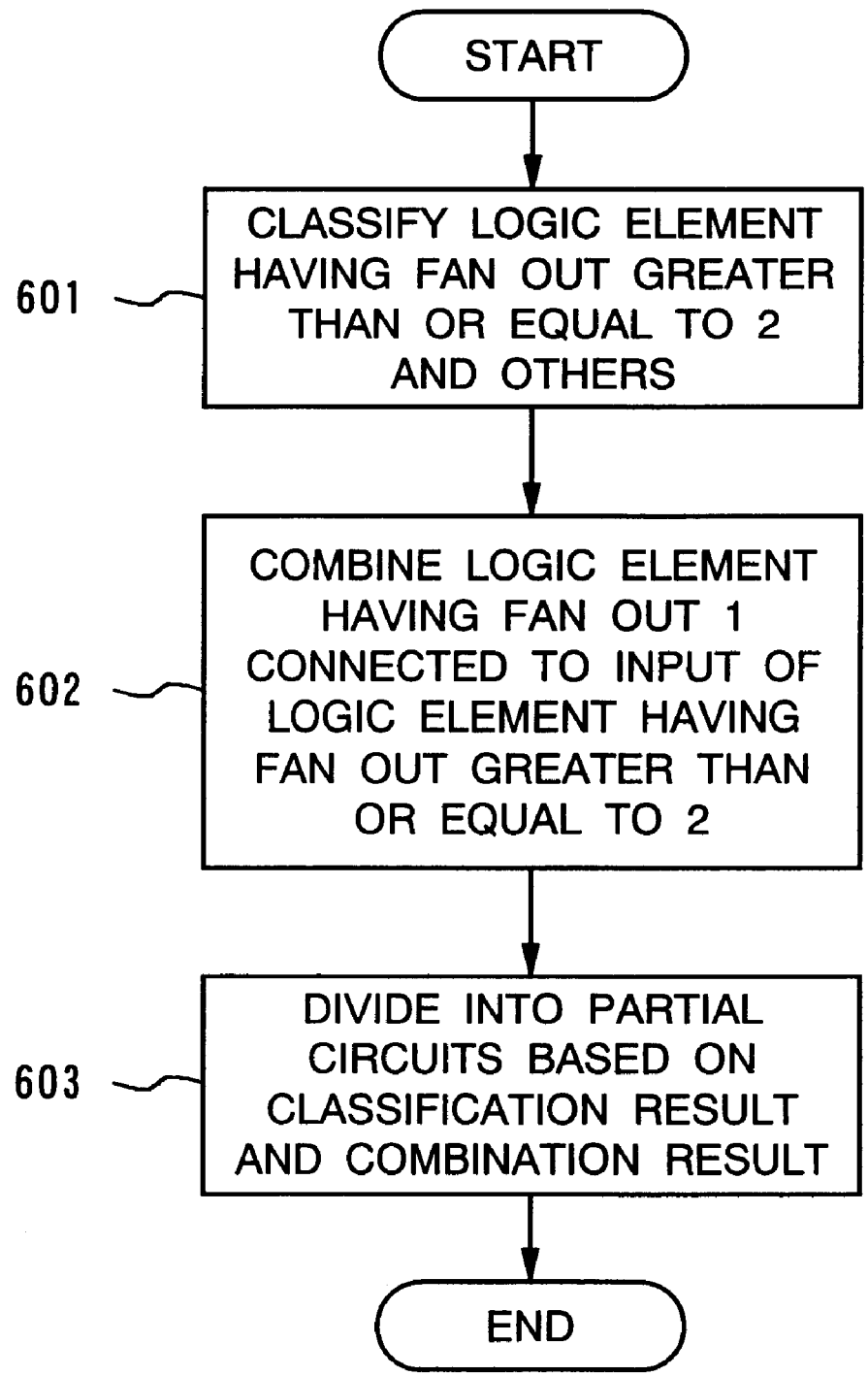
FIG. 6 is a flowchart for explaining a content of process of the second embodiment of the logic dividing portion.

Dividing process of the logic dividing portion 104 will be discussed with reference to a flowchart of FIG. 6.

The circuit element classifying portion 201 classifies circuit elements (circuit components) having fan out grater than or equal to "2" and circuit elements (circuit components) other than the former with respect to the circuit elements forming the inputted logic circuit (step 601).

The cone generating portion 202 takes the circuit elements having fan out greater than or equal to "2" among the circuit elements classified by the circuit element classifying portion 201, as a unit for circuit division, and combines the circuit element having fan out "1" to fan in of the circuit elements having fan out greater than or equal to "2", as much as possible (step 602). Namely, the cone generating portion 202 sequentially traces the circuit elements having fan out "1" connected to the input terminal of the circuit element having fan out greater than or equal to "2" until the circuit element having fan out greater than or equal to "2" is reached.

Then, on the basis of result of classification and foregoing result of combination, the foregoing logic circuit is divided into a plurality of partial circuits (step 603).

FIG. 7 is an illustration diagrammatically showing one example of a circuit dividing method in the logic dividing portion 104 by the second embodiment of the logic circuit synthesizing system according to the present invention.

The logic circuit showing FIG. 7 is constituted of circuit components (circuit elements) (1), (2), (3), (4), (5), (6), (7), (8).

In division, except for the input/output portion of the circuit components to be natural dividing points, for the elements having fan out greater than or equal to "2" to be a cause of increasing of area or delay of the circuit, the circuit element classifying portion 201 classifies into circuit elements (1), (4), and (8), and other logic elements (2), (3), (5), (6) and (7). In the cone generating portion 202, as a unit of division of the logic element of fan out "2", the circuit element group (2), (3), (5), (6) and (7) having fan out "1" and thus being easy to control area or delay of the circuit are combined with the circuit element (8). When the circuit is input for the first time, such dividing form is taken for a reason that a single dividing result can be obtained . As a result, the logic circuit is divided into three of the partial circuit "A(1)", the partial circuit "B(4)" and the partial circuit "C(2, 3, 5, 7, 8)".

Figure 8:
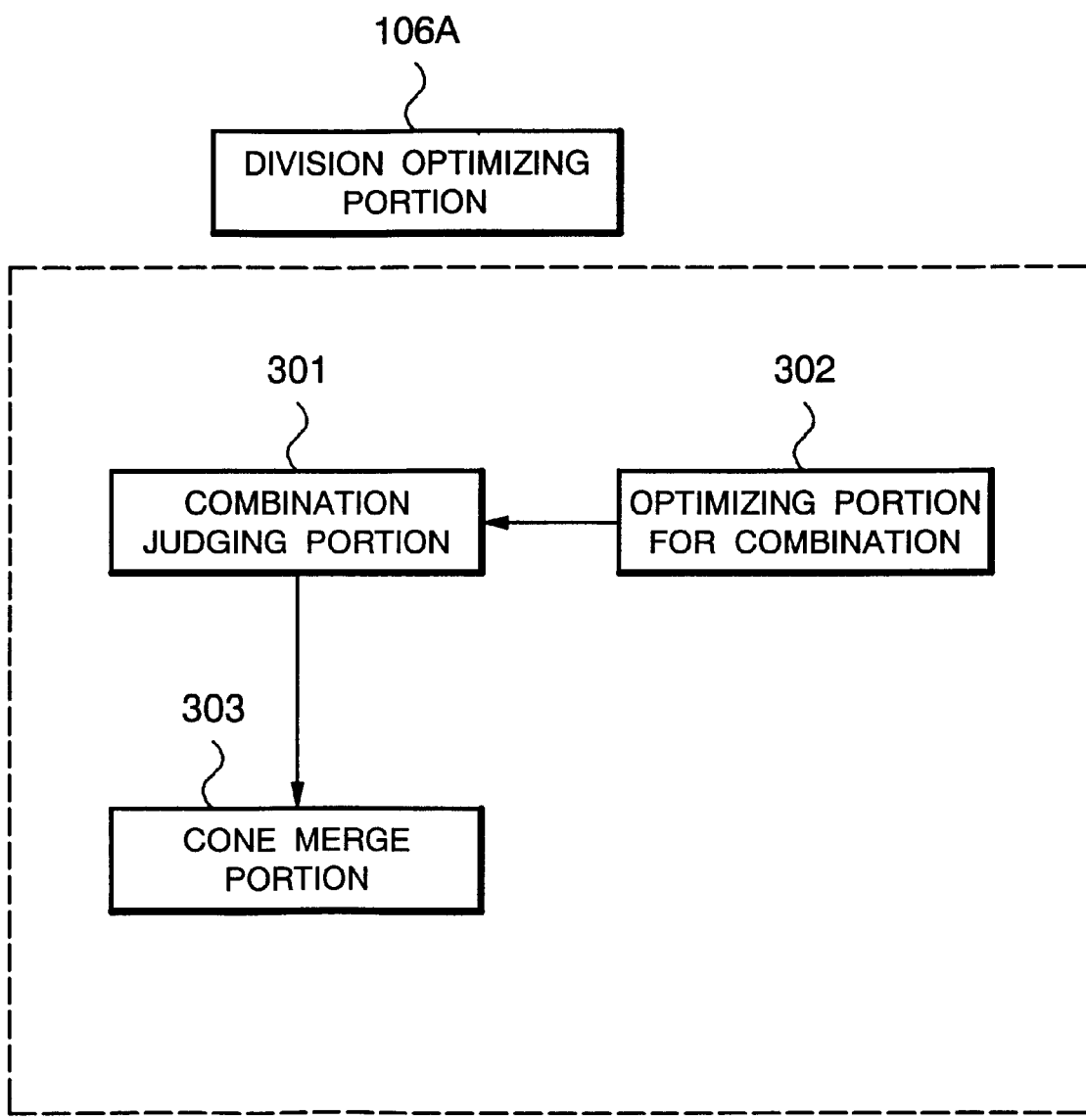
FIG. 8 is a block diagram for explaining a construction of the third embodiment of a division optimizing portion according to the present invention.

Next, a further embodiment of the present invention will be discussed. FIG. 8 is an illustration showing an example of construction of the logic dividing portion of the third embodiment of the logic circuit synthesizing method according to the present invention.

Referring to FIG. 8, in the third embodiment of the present invention, upon synthesizing at the first time, the division optimizing portion 106A is constructed with an optimizing portion 302 for combination performing optimization for combination of adjacent divided partial circuits, a combination judging portion 301 making judgment whether adjacent divided partial circuits are to be combined or not on the basis of result of optimization, and a cone merging portion 303 making a combination of the divided partial circuits determined by the combination judging portion 301 as new divided partial circuit.

After execution of optimization after combination, the combination judging portion 301 selects combination to be closer to the constraint of the circuit. Namely, the combination judging portion 301 makes judgment whether combination is advantageous or not upon combining a plurality of adjacent partial circuits advantageous for optimization.

In the foregoing first embodiment, the logic optimization process by the division optimizing portion 106A is individually applied to the divided partial circuits divided by the logic dividing portion 104. Accordingly, logic optimization is applied for overall system. As a result, it is possible that the optimizing performance can be lower than the logic synthesizing method not considering design modification. Therefore, in the third embodiment of the present invention, in order to make the design modification closer to the logic synthesizing method not considering design modification as much as possible, the combining judgment portion 301 executes logic optimization by combining periphery with taking the partial circuit which cannot satisfy the given constraint. If the combination becomes closer to the constraint for the whole, the cone merge portion 303 combines the divided circuit. Combination of the divided circuit is performed upon synthesis of the initial design.

Figure 9:
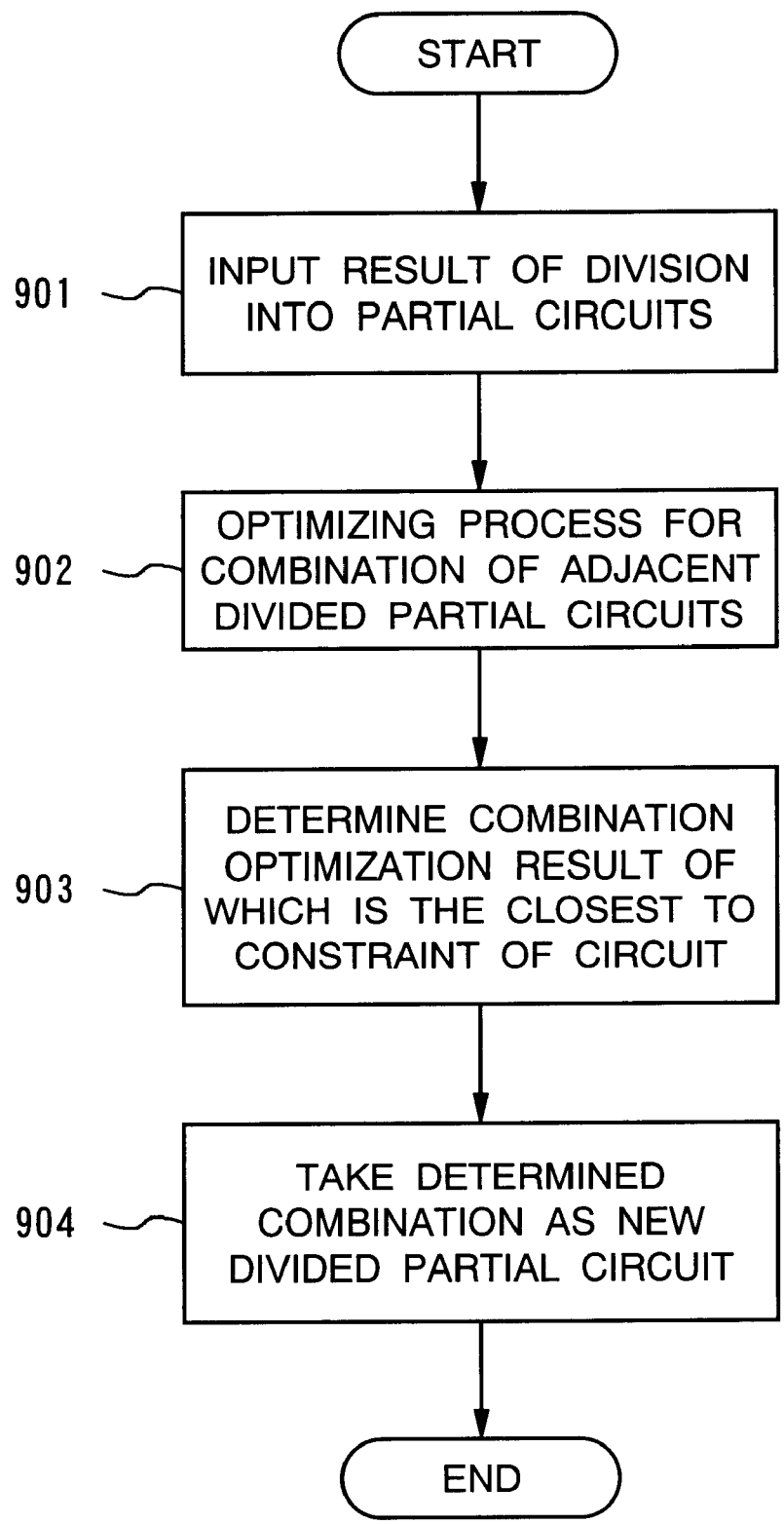
FIG. 9 is a flowchart for explaining content of process of the third embodiment of the division optimizing portion.

The logic optimization process of the division optimizing portion 106A will be discussed with reference to the flowchart of FIG. 9.

When the division result to the partial circuit is input from the logic dividing portion 104 (step 901), the optimizing portion 302 for combination performs logic optimization for all of possible combination of the adjacent divided partial circuits (step 902).

After execution of the optimization, the combination judgment portion 301 determines combination, in which the result of optimization becomes the closest to the inputted constraint (step 903). Subsequently, the cone merge portion 303 makes the determined combination of the partial circuits as new partial circuit (step 904).

Figure 10:
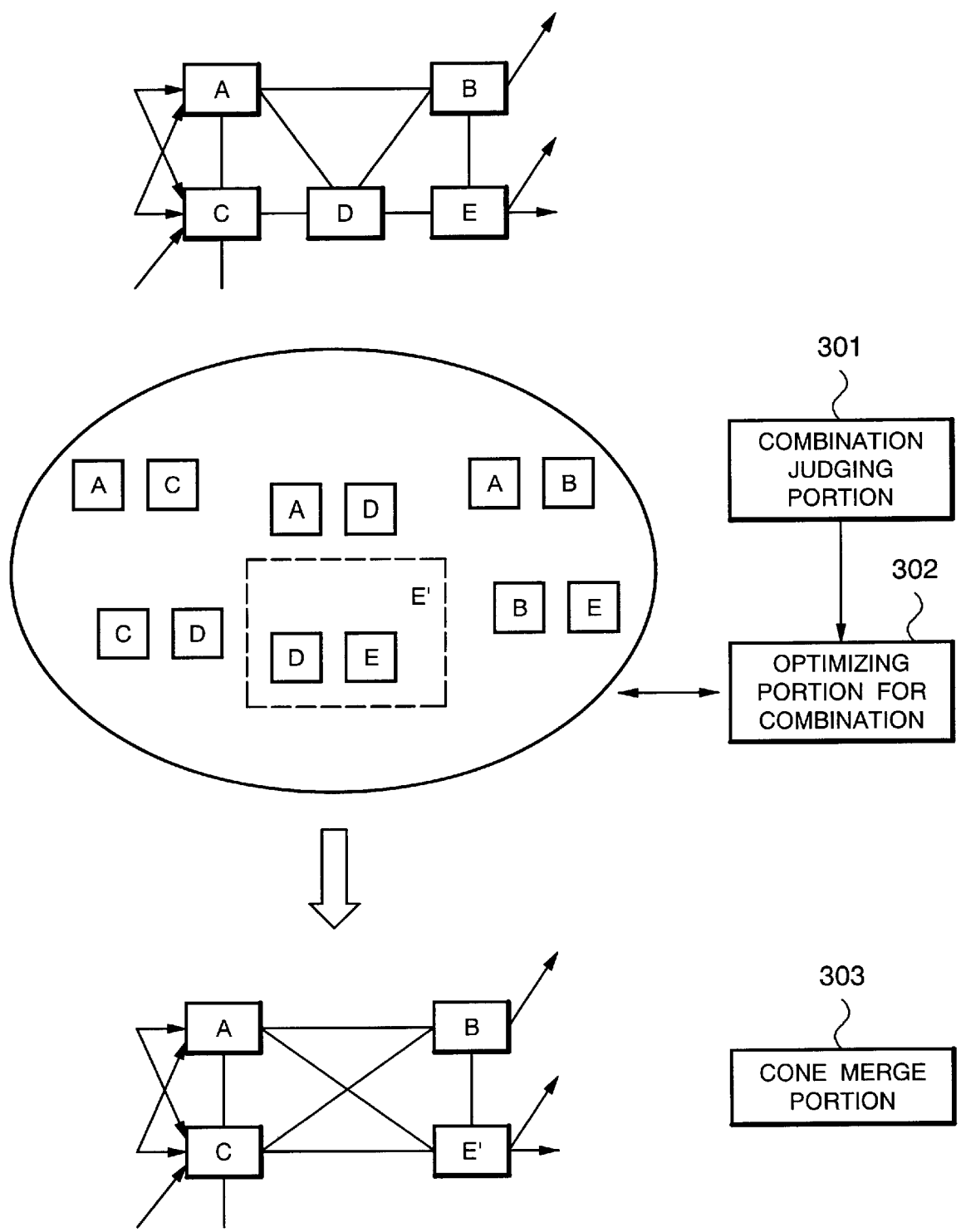
FIG. 10 is an explanatory illustration diagrammatically showing one example of combination of divided partial circuit in the third embodiment of the present invention.

FIG. 10 is an explanatory illustration diagrammatically showing one example of the process of the division optimizing portion 106A of the third embodiment of the logic circuit synthesizing method according to the present invention.

The circuit is assumed to be divided into partial circuits "A", "B", "C", "D", "E" as shown in FIG. 10. In this case, for all of combinations of the adjacent partial circuits (A, C), (C, D), (A, D), (D, E), (A, B), (B, E), actual optimization is performed by the optimizing portion 302 for combination.

On the basis of result of optimization, the combination judging portion 301 determines combination to achieve the result the closest to the constraint of the circuit. FIG. 10 shows the case where combination of the partial circuits (D, E) is determined as achieving the result the closest to the constraint of the circuit, by the combination judging portion 301.

The cone merge portion 303 takes the combination of the partial circuits (D, E) as new divided partial circuit "E-1". By this, it becomes possible to obtain a result close to the case where the overall circuit is optimized without performing division.

Normally, it is possible to use the logic dividing portion 104 of the second embodiment and the division optimizing portion 106A by the third embodiment, in combination.

According to the present invention, by dividing the circuit before modification into a plurality of partial circuits, and holding the division information, logic optimization is newly performed only for the partial circuit which is subject to design modification, and the circuit before modification is re-used for the remaining partial circuit other than that subject to modification. By this, modification in the circuit can be minimized. As a result, upon expressing the circuit by actual physical elements, even when modification is caused in the design, the portion not modified can be used as is. Therefore, physical design has to be effect only for the modified portion to simplify design upon occurrence of design modification.

On the other hand, by handing with dividing the circuits, scale of the circuit to be handled by the optimizing portion at one time becomes quite small in relation to the overall circuit to enable speeding up of the process. Also, since circuit is divided by counting number of fan out of the circuit elements, the circuit of quite large circuit scale can be handled by providing a storage capacity of the computer linearly correspond to the circuit scale to be handled.

Furthermore, by forming large divided partial circuit in certain extent by combination of the divided partial circuit, even for the method for individually performing logic optimization for the divided partial circuit according to the present invention, it becomes possible to obtain a result comparable with the case where overall circuit is optimized without division.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A logic circuit synthesizing method for optimizing a logic circuit for satisfying given constraints, comprising the steps of:

dividing said logic circuit into a first plurality of partial circuits on the basis of a circuit information of said logic circuit, said first plurality of partial circuits having a number of divisions;

outputting a first resultant circuit by:

providing logic optimization per each of said first plurality of partial circuits for satisfying said given constraints and synthesizing the optimized plurality of partial circuits;

upon design modification of the logic circuit, dividing said first resultant circuit into a second plurality of partial circuits on the basis of said circuit information of said logic circuit, said second plurality of partial circuits having the same number of divisions as the first plurality of partial circuits; and outputting a second resultant circuit by providing logic optimization only for the partial circuits among the second plurality of partial circuits, for which design modification is effected to produce modified partial circuits, and re-using the partial circuits among the second plurality of partial circuits other than the modified partial circuits and synthesizing said modified partial circuits and said re-used partial circuits as said second circuit.

2. A logic circuit synthesizing method as set forth in claim 1, wherein, dividing said logic circuit into said first plurality of partial circuits, comprises:

classifying circuit elements forming said logic circuit into circuit elements having a fan out greater than or equal to 2 and circuit elements having a fan out equal to 1, taking said circuit elements having a fan out greater than or equal to 2 for defining said first plurality of partial circuits, and further defining said first plurality of partial circuits to include circuit elements having fan out of 1 connected to an input terminal of said circuit elements having a fan out greater than or equal to 2.

3. A logic circuit synthesizing method as set forth in claim 1, wherein, in division of said logic circuit into said partial circuits, circuit elements forming said logic circuit are classified into circuit elements having fan out greater than or equal to 2 and circuit elements having fan out 1, with taking said circuit elements having fan out greater than or equal to 2 as a unit of division, circuit elements having fan out 1 connected to input terminal of said circuit elements having fan out greater than or equal to 2 are aggregated for combination by sequentially tracing said circuit elements having fan out 1 up to reaching to the circuit element having fan out greater than or equal to 2, and on the basis of said classification result and said combination result, said logic circuit is divided into partial circuits.

4. A logic circuit synthesizing method as set forth in claim 1, wherein, optimizing said first plurality of partial circuits comprises:

optimizing all combinations of adjacent partial circuits;

selecting a combination of partial circuits closest to a given constraint; and taking the combination of partial circuits as a new partial circuit.

5. A logic circuit synthesizing system for optimizing a given logic circuit for satisfying a given area, delay and other constraints, comprising:

logic dividing means for dividing an inputted logic circuit into a first plurality of partial circuits having a number of divisions on the basis of circuit information of said logic circuit;

constraint input means for inputting area, delay or other constraints given for said partial circuits;

division optimizing means for executing logic optimization for each of said first plurality partial circuits of said logic circuit input for the first time and performing optimization in order to satisfy said constraints;

division means for dividing a resultant circuit from said first plurality of partial circuits into a second plurality of partial circuits on the basis of said circuit information of said logic circuit, said second plurality of partial circuits having the same number of divisions as the first plurality of partial circuits;

newly optimizing means for newly executing logic optimization only for a given partial circuit among the second plurality of partial circuits, in which design modification is caused, when design modification of the given partial circuit is effected;

re-using means for holding the results of logic optimization at the first time with respect to the first plurality of partial circuits other than said given partial circuit for which design modification is effected;

combining means for combining said first plurality partial circuits held by said re-using means and the given partial circuit newly performed logic optimization; and synthesized result outputting means for outputting a synthesizing result by said division optimizing means or combination result by said combining means.

6. A logic circuit synthesizing system as set forth in claim 5, which further comprises:

first time circuit input means for initially inputting said logic circuit for the logic circuit, for which design modification is expected;

modified partial circuit inputting means for performing input of said given partial circuit after design modification; and former time circuit input means for inputting the logic circuit as a result of synthesis.

7. A logic circuit synthesizing system as set forth in claim 5, wherein said logic dividing means comprises:

circuit element classifying means for classifying circuit elements having fan out 1 and circuit elements having fan out greater than or equal to 2 concerning circuits elements forming said logic circuit; and cone generating means for performing division with taking the circuit elements having fan out greater than or equal to 2 as a unit for division and aggregating circuit elements having fan out 1 connected to the input terminal of said circuit elements having fan out greater than or equal to 2.

8. A logic synthesizing system as set forth in claim 7, wherein said cone generating means performs division with taking the circuit elements having fan out greater than or equal to 2 as a unit for division and aggregating circuit elements having fan out 1 connected to input terminal of said circuit elements having fan out greater than or equal to 2 are aggregated for combination by sequentially tracing said circuit elements having fan out 1 up to reaching to the circuit element having fan out greater than or equal to 2.

9. A logic circuit synthesizing system as set forth in claim 5, wherein said divided logic optimizing means comprises:

logic optimizing means for combination for performing logic optimization for all of combinations of adjacent divided partial circuits;

combination judging means for selecting a combination of partial circuits closest to the constraint of the circuit input upon optimization as a result of said logic optimization; and cone merge means for taking the selected combination of the partial circuits as a new partial circuit.

10. A logic circuit synthesizing system as set forth in claim 5, wherein said logic dividing means comprises circuit element classifying means for classifying circuit elements having fan out 1 and circuit elements having fan out greater than or equal to 2 concerning circuits elements forming said logic circuit; and cone generating means for performing division with taking the circuit elements having fan out greater than or equal to 2 as a unit for division and aggregating circuit elements having fan out 1 connected to the input terminal of said circuit elements having fan out greater than or equal to 2, and said divided logic optimizing means comprises:

logic optimizing means for combination for performing logic optimization for all of combinations of adjacent divided partial circuits;

combination judging means for selecting a combination of the partial circuits closest to the constraint of the circuit input upon optimization as a result of said logic optimization; and cone merge means for taking the selected combination of the partial circuits as a new partial circuit.

11. A storage medium storing a computer program performing logic circuit synthesis for optimizing a given logic circuit for satisfying a given area, delay and other constraints, comprising the steps of:

dividing an inputted logic circuit into a first plurality of partial circuits on the basis of a circuit information of said logic circuit, said first plurality of partial circuits having a number of divisions;

outputting a first resultant circuit by providing logic optimization per each partial circuit for satisfying said given constraints and synthesizing the partial circuits provided logic optimization;

upon design modification of the logic circuit, dividing said first resultant circuit into a second plurality of partial circuits on the basis of said circuit information of said logic circuit, said second plurality of partial circuits having the same number of divisions as the first plurality of partial circuits; and outputting a second resultant circuit by providing logic optimization only for the partial circuit, for which design modification is effected, re-using the partial circuits among the second plurality of partial circuits other than that subject to design modification and synthesizing said modified partial circuit which is newly optimized and said re-used partial circuits.

12. A storage medium storing a computer program performing logic circuit synthesis as set forth in claim 11, wherein, in division of said logic circuit into said partial circuits, said computer program comprises the steps of:

circuit elements forming said logic circuit are classified into circuit elements having fan out greater than or equal to 2 and circuit elements having fan out 1, with taking said circuit elements having fan out greater than or equal to 2 as a unit of division, circuit elements having fan out 1 connected to input terminal of said circuit elements having fan out greater than or equal to 2 are aggregated for combination, and on the basis of said classification result and said combination result, said logic circuit is divided into partial circuits.

13. A storage medium storing a computer program performing logic circuit synthesis as set forth in claim 11, wherein, in division of said logic circuit into said first plurality of partial circuits comprises, said computer program comprises the steps of:

optimizing all combinations of adjacent partial circuits;

selecting a combination of partial circuits closest to a given constraint; and taking the combination of partial circuits as a new partial circuit.

* * * * *